(12) United States Patent
Dias

(10) Patent No.: US 7,230,559 B2
(45) Date of Patent: Jun. 12, 2007

(54) QUANTIZER IN A MULTILEVEL SIGMA-DELTA ANALOGUE/DIGITAL CONVERTER

(75) Inventor: Victor Da Fonte Dias, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/278,195

(22) Filed: Mar. 31, 2006

(65) Prior Publication Data

US 2006/0244643 A1 Nov. 2, 2006

(30) Foreign Application Priority Data

Apr. 4, 2005 (DE) .................... 10 2005 015 390

(51) Int. Cl.
*H03M 1/34* (2006.01)
(52) U.S. Cl. .................... 341/158; 341/143; 341/159; 341/200
(58) Field of Classification Search ................ 341/158, 341/143, 159, 131, 138, 120, 200
See application file for complete search history.

(56) References Cited

U.S. PATENT DOCUMENTS

| 4,365,236 | A | * | 12/1982 | Maida | 341/159 |
| 5,206,649 | A | * | 4/1993 | Gulczynski | 341/156 |
| 5,610,604 | A | * | 3/1997 | Leacock et al. | 341/138 |
| 5,760,729 | A | * | 6/1998 | Rumreich | 341/159 |
| 5,870,042 | A | * | 2/1999 | Noda | 341/120 |
| 5,877,718 | A | | 3/1999 | Andoh et al. | 341/155 |
| 5,936,566 | A | * | 8/1999 | Park | 341/159 |
| 6,072,416 | A | * | 6/2000 | Shima | 341/159 |
| 6,198,420 | B1 | * | 3/2001 | Ryan et al. | 341/155 |
| 6,346,898 | B1 | | 2/2002 | Melanson | 341/143 |
| 6,426,714 | B1 | * | 7/2002 | Ruha et al. | 341/143 |
| 6,473,019 | B1 | * | 10/2002 | Ruha et al. | 341/143 |
| 6,556,158 | B2 | * | 4/2003 | Steensgaard-Madsen | 341/131 |

OTHER PUBLICATIONS

Gilbert, Barrie; "A Monolithic Microsystem for Analog Synthesis of Trigonometric Functions and Their Inverses"; IEEE Journal of Solid-State Circuits; vol. SC-17, No. 6; pp. 1179-1191, Dec. 1982.

* cited by examiner

*Primary Examiner*—Jean Bruner Jeanglaude
(74) *Attorney, Agent, or Firm*—Baker Botts L.L.P.

(57) ABSTRACT

The quantizer (2') has an input network (5) which generates N different drive signals ($V_{ij}$) as a function of the quantizer input signal ($V_{I+}-V_{I-}$). The input network (5) is designed in such a way that a value of the respective drive signal ($V_{ij}$) which is greater than a comparison value indicates that the quantization threshold which is associated with the respective drive signal ($V_{ij}$) has been exceeded. Furthermore, the quantizer has a switching network (9), which associates the N drive signals ($V_{ij}$) with the N comparator inputs.

16 Claims, 5 Drawing Sheets

(PRIOR ART)

QUANTIZER IN A MULTILEVEL SIGMA-DELTA ANALOGUE/DIGITAL CONVERTER

PRIORITY

This application claims priority from German Patent Application No. DE 10 2005 015 390.9, which was filed on Apr. 4, 2005, and is incorporated herein by reference in its entirety.

TECHNICAL FIELD

The invention relates to a quantizer having a plurality of quantization thresholds for a sigma-delta analogue/digital converter (SD-ADC). The invention also relates to an SD-ADC which has a quantizer such as this.

BACKGROUND

FIG. 1 shows a block diagram of a sigma-delta analogue/digital converter (SD-ADC). This has a closed control loop which includes a loop filter 1 (frequently also referred to as a noise-shaping filter), a quantizer 2 and a digital/analogue converter 3 (DAC). The SD-ADC illustrated in FIG. 1 is a so-called continuous-time SD-ADC, that is to say the loop filter 1 of the SD-ADC is an analogue, continuous-time filter, whose output value is valid throughout the entire time period. In contrast, so-called switched capacitor SD-ADCs are known from the prior art, whose loop filters have capacitances which are switched in order to model resistive filter components, and in which case the output signal is valid only at specific times.

The SD-ADC in FIG. 1 has an analogue signal X that is to be converted applied to its input. The difference between the analogue input signal X and the output signal from the DAC 3 is fed to the analogue loop filter 1, whose output side drives the quantizer 2. The quantizer 2 generates an oversampled digital signal Y on the output side, whose clock rate corresponds to the clock rate of the signal clk used to clock the quantizer 2. The quantizer 2 thus represents an analogue/digital converter. The mean value of the signal Y corresponds to the analogue input signal X. The SD-ADC illustrated in FIG. 1 is a multilevel SD-ADC (also referred to as a multibit SD-ADC). In the case of a multilevel SD-ADC the quantizer 2, as a multilevel or multibit quantizer, has a plurality of N quantization thresholds. In the typical implementation of the quantizer 2 as a flash quantizer, the quantizer has N comparators which operate in parallel, in which case each comparator has a specific associated reference $REF_j$, where $REF_j < REF_{j+1}$. The references $REF_j$ are typically reference voltages. However, it is also feasible to use reference currents as references.

If the input signal to the quantizer 2 is in the region above $REF_j$ and below $REF_{j+1}$, then all of the comparators with reference voltages of less than or equal to $REF_j$ produce a logic 1 at their output, while the comparators with reference voltages of greater than or equal to $REF_{j+1}$ produce a logic 0 at their output. The resultant code of the output signal Y from the quantizer 2, which output signal Y has a length of N bits and results from the combination of the binary comparator output signals, is referred to, by analogy with a liquid thermometer, as a "thermometer code".

The output signal Y from the quantizer 2 is converted by means of the DAC 3 to an analogue signal which is compared with the analogue input signal X. When the control loop is in the steady state, the analogue input signal X and the output signal from the DAC 3 correspond to one another.

The loop illustrated in FIG. 1 is typically followed by a code converter (not illustrated) which converts the output signal Y from the quantizer 2 from the thermometer-code representation to a binary-code representation. Furthermore, a digital low-pass filter and a decimator (not illustrated) are arranged on the output side of the code converter, with the low-pass filter carrying out an averaging process, and with the decimator reducing the sampling rate.

The performance of the multilevel SD-ADC is governed primarily by the linearity of the internal DAC 3. The DAC 3 in general has N unit elements which—if no code conversion is carried out in the quantizer 2—are activated or deactivated as a function of the thermometer-code output signal, which has a length of N bits, from the quantizer 2. The unit elements are typically switchable unit current sources, with the output signal from the DAC 3 being obtained from the superimposition of the currents from the N unit current sources. The unit elements of the DAC 3 are ideally completely identical. In a real DAC, the unit elements are, however, slightly different, that is to say the output currents from the unit current sources are not completely identical in the activated state. There is thus a so-called mismatch, which results in non-linear distortion with respect to the output signal from the DAC 3. Since the output signal from the DAC 3 is applied to the control loop in the same way as the input signal X of the SD-ADC, any non-ideal property of the output signal from the DAC 3 is not suppressed in the control loop, and is evident as distortion in the signal Y.

In order to improve the linearity of the DAC 3, it is known for a so-called DEM block (DEM—dynamic element matching; frequently also referred to as a randomizer or scrambler block) to be provided directly at the input of the DAC 3 or within the DAC 3 (see FIG. 2). This results in the same unit elements in the DAC 3 not always being activated, but in different unit elements DAC 3 being activated at different times for a specific output signal from the quantizer 2, in which case the number of active unit elements remains constant. The linearity error of the DAC 3 is in this way reduced when averaged over time. The scrambling of the association of the unit elements of the DAC 3 can be achieved by dynamic scrambling of the code of the output signal Y from the quantizer 2, that is to say by interchanging the digits in the code signal. By way of example, a code "00111000" is generated on scrambling of a thermometer code "11100000" with a length of 8 bits. The scrambling process can be carried out using various DEM algorithms. DEM algorithms which are based on noise shaping are particularly important, in which the influence of the mismatch between the DAC unit elements is initially randomly distributed, and is then removed from the signal band.

In order to carry out the code scrambling, the DEM block 4 has digital logic which has a latency time, that is to say the output signal of the DEM block 4 reacts to a change in the signal Y only after a certain delay. This latency time acts as a dead time in the control loop and causes a deterioration in the stability characteristics of the control loop.

It is known from the document U.S. Pat. No. 6,346,898 B1 that any deterioration in the stability of the control loop caused by code scrambling can be overcome by placing a DEM block upstream of the reference inputs of the comparators within the quantizer 2' rather than a DEM block 4 being placed between the output of the quantizer 2 and the input of the DAC 3 (see FIG. 3). In an SD-ADC such as this, the association between the references and the individual comparators in the quantizer 2' is dynamically scrambled using a predetermined DEM algorithm. This approach is thus referred to as dynamic element matching in a reference path.

As a result of the scrambling of the references, different output bit lines of the signal Y are activated at different sampling times for one specific input signal to the quantizer 2'. Since each comparator output is permanently connected to one unit element in the DAC 3, different unit elements in the DAC 3 are thus also activated at different sampling times. The effect of the DEM block located outside the control loop, as shown in FIG. 3, is thus analogous to that of the DEM block 4 arranged within the control loop, as shown in FIG. 2, although the dynamic scrambling process shown in FIG. 3 does not involve any additional dead time within the control loop. Furthermore, in the case of the approach illustrated in FIG. 3, the influence of any mismatch within the quantizer 2' (for example in the production of the references or with respect to the comparators themselves) is randomly distributed, and is removed from the signal band.

A network which comprises a resistor chain, coming from identical resistors, and identical current sources feeding the nodes in the resistor chain is known from the document "A Monolithic Microsystem for Analog Synthesis of Trigonometric Functions and their Inverses", G. Gilbert, IEEE Journal of Solid-state Circuits, Vol. 17, pages 1179–1191, December 1982. If the resistor chain is fed with a differential input voltage, $E_x$, this results in a parabolic potential profile over the individual nodes in the resistor chain. The maximum in the parabolic potential profile for the situation where $E_x=0$ is located at the central node in the resistor chain, and migrates in one direction or the other when the voltage $E_x$ is increased or decreased.

SUMMARY

One object of the invention is to specify a circuit concept for scrambling of the DAC unit elements, which represents an alternative to the concept described in the document U.S. Pat. No. 6,346,898 B1 and is based in a similar manner on scrambling within the quantizer, but without scrambling the association between the references and the comparators as in the document U.S. Pat. No. 6,346,898 B1.

This object can be achieved by a quantizer having a plurality of N quantization thresholds for quantization of an analogue quantizer input signal for a sigma-delta analogue/digital converter, comprising an input network, which receives the quantizer input signal and generates N different drive signals, which are associated with the quantization thresholds, as a function of the quantizer input signal, in which case, for the drive signals, a value of the respective drive signal which is greater, or in one alternative embodiment less, than a comparison value which is identical for all drive signals indicates that the quantizer input signal has exceeded the respectively associated quantization threshold, a plurality of N comparators each having one comparator input, and which, on the output side, generate a quantized signal which corresponds to the quantizer input signal, and a switching network, which receives the N drive signals and associates them with the N comparator inputs, in which case the association can be controlled as a function of a control signal.

$N_-$ of the N drive signals each may have a value less than the comparison value and $N_+$ of the N drive signals each may have a value greater than the comparison value, and both the number $N_-$ and the number $N_+$ of the drive signals can be dependent on the quantizer input signal. The quantizer input signal and the drive signals can be differential signals, in particular with the comparison value being 0 V. The input network may comprise a resistor chain of N resistors with identical resistances, in particular N identical resistors, with the N drive signals being obtained from the potentials at the nodes of the resistors. The differential quantizer input signal can be received by both outer nodes of the resistor chain. The input network may comprise N−1 current sources with identical currents, in particular N−1 identical current sources, with each node between two resistors in the resistor chain being fed from in each case one of the current sources. The N drive signals can each be obtained from the difference between the potentials at the two nodes of a respectively different resistor of the N resistors. The following relationship may apply to the potentials of the nodes of the N resistors:

$$V_i = \frac{(N+1-i)}{N} \cdot V_1 + \frac{(i-1)}{N} \cdot V_{N+1} + \frac{(i-1)(N+1-i)}{2} \cdot RI_0,$$

where the variable $V_i$ describes the potential at the i-th node in the resistor chain, the variable R describes the resistance of a resistor in the resistor chain, and the variable $I_0$ describes the current from one of the current sources. The product of the current from one of the current sources and the resistance of a resistor in the resistor chain can be proportional to the width of the permissible voltage value range of the quantizer input signal. A sigma-delta analogue/digital converter, may comprise such a quantizer and further comprise a control device for generation of the control signal, with the association of the N drive signals with the N comparator inputs being controlled via the control signal.

Thus, a quantizer may have N comparators for N quantization thresholds and one specific input network. The input network receives the quantizer input signal and generates N different drive signals as a function of the quantizer input signal. The input network is designed in such a way that, for the drive signals, a value of the respective drive signal which is greater, or in one alternative embodiment less, than a comparison value (for example 0 V) which is identical for all drive signals indicates that the quantizer input signal has exceeded the respectively associated quantization threshold. Furthermore, the quantizer according to the invention has a switching network, which receives the N drive signals and associates them with the N comparator inputs, in which case the association can be controlled as a function of a control signal.

The quantizer according to the invention is based on the idea of using the input network to convert the quantizer input signal, which is otherwise supplied in the same way to all of the comparators in a conventional flash quantizer, to N drive signals, in which case the overshooting and the undershooting of the quantization thresholds can be read just on the basis of the individual values of the drive signals. Only one comparison of the respective value with a comparison value which is identical for all the drive signals is required in each case for this purpose. This task is carried out by the comparators, which each compare the drive signal fed into the comparator input with the comparison value. Thus, in this embodiment of the quantizer, no different references associated with the quantization thresholds are used.

In this case, the switching network is used to scramble the association between the drive signals rather than the association between the references, as in the document U.S. Pat.

No. 6,346,898 B1. The scrambling process is thus related to the signal paths of the comparators, rather than to the reference paths. However, the effect of the scrambling of the signal paths corresponds to that of scrambling the reference paths.

The alternative circuit concept according to the invention thus has the advantages of the circuit concept that is known from the document U.S. Pat. No. 6,346,898 B1 with a comparable circuit complexity level, a comparable power loss consumption and a comparable chip area. The signal delay which is associated with the input network and the switching network is considerably less than in the case of a circuit concept with a DEM block in the feedback path (see FIG. 2).

It should be noted that the switching network could also represent a through-connection for some drive signals, in which case the drive signals would not all be subjected to scrambling.

Furthermore, in order to achieve a modified object of specifying an alternative circuit concept for a flash quantizer, it would also be generally feasible to dispense with the switching network.

Typically, $N_-$ of the N drive signals each have a value less than the comparison value and $N_+$ of the N drive signals each have a value greater than the comparison value. The number $N_-$ as well as the number $N^+$ of drive signals are dependent on the quantizer input signal.

It is advantageous for the drive signals to be differential signals. If the comparison value corresponds to 0 V, the two single-ended signal elements of the differential drive signals can each be fed in a simple manner into the non-inverting input and the inverting input of the comparators, with the comparator comparing the drive signal with the comparison value without supplying a reference corresponding to the comparison value.

According to one advantageous embodiment the input network comprises a resistor chain of N resistors with identical resistances. In this case, the N drive signals are obtained from the potentials at the nodes of the resistors. The resistors in the resistor chain are typically identical resistors, so that resistor tolerances act in the same way for the individual drive signals (matching). It should be noted that the individual resistors can also be formed from resistor elements.

In the case of a differential quantizer input signal, the quantizer input signal is advantageously fed into both outer nodes of the resistor chain.

In this case, it is advantageous for the input network to comprise N−1 current sources with identical currents. In this case, each current source feeds a respectively different node between two resistors in the resistor chain. The current sources are typically identical current sources, so that current tolerances act in the same way for the individual drive signals.

When an input network such as this is fed with a differential quantizer input voltage, this results in a parabolic potential profile over the individual nodes in the resistor chain. The maximum of the parabolic potential profile occurs in the centre of the resistor chain when the quantizer input voltage is 0 V, and migrates in one direction or the other when the quantizer input voltage is increased or decreased.

In this case, the N drive signals advantageously each result from the potential difference between the two nodes of a respectively different resistor of the N resistors. When the parabolic potential profile as described above is taken into account, $N_+$ adjacent differential drive signals each have a positive mathematical sign, while $N_-$ adjacent differential drive signals each have a negative mathematical sign. The separating line between positive and negative mathematical signs in this case marks the maximum of the potential profile, which migrates as a function of the quantizer input voltage. In this case, in order to quantize the quantizer input signal, only the number $N_+$ of differential drive signals with positive mathematical signs and the number $N_-$ of differential drive signals with negative mathematical signs need be detected by means of the differentially driven comparators.

The multilevel SD-ADC according to the invention shown in FIG. 10 has a quantizer according to the invention, as described above. Furthermore a control device is provided for generation of that control signal which controls the switching network in the quantizer. The association of the N drive signals with the N comparator inputs is dynamically scrambled by means of the control signal.

In this case, the multilevel SD-ADC is advantageously a continuous-time SD-ADC.

BRIEF DESCRIPTION OF THE DRAWINGS

The invention will be explained in more detail in the following text using two exemplary embodiments and with reference to the drawings, in which.

DETAILED DESCRIPTION

Figure 1:
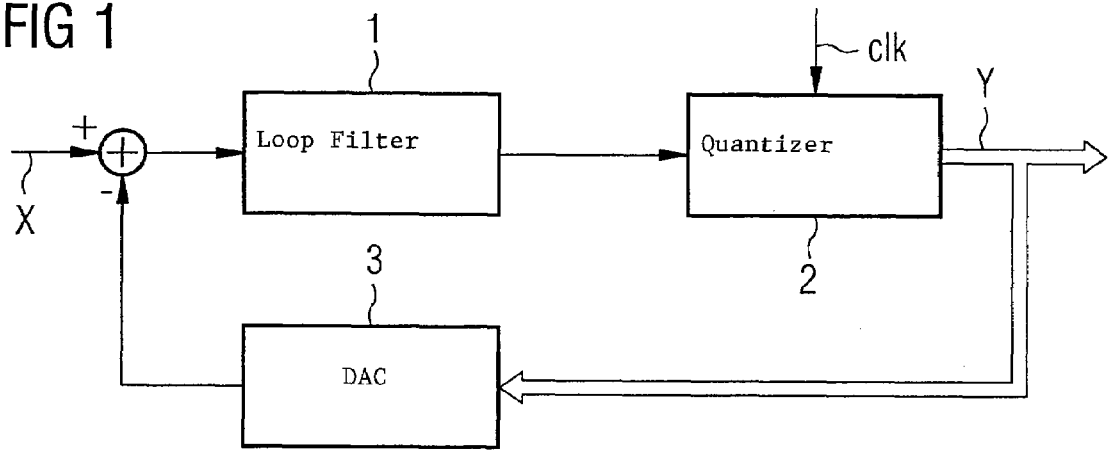
FIG. 1 shows a block diagram of a multilevel SD-ADC (prior art)
Figure 2:
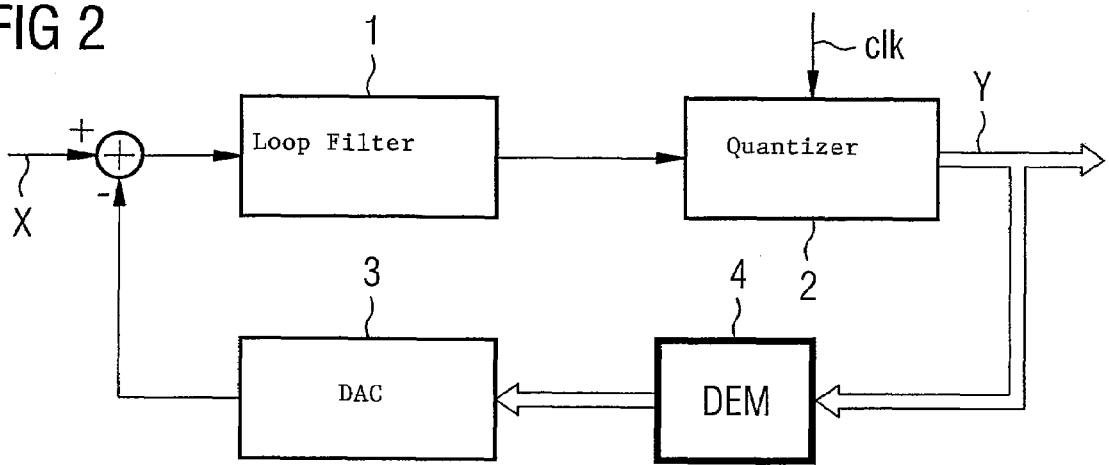
FIG. 2 shows a block diagram of a multilevel SD-ADC with the DEM functionality implemented in the feedback path (prior art)
Figure 3:
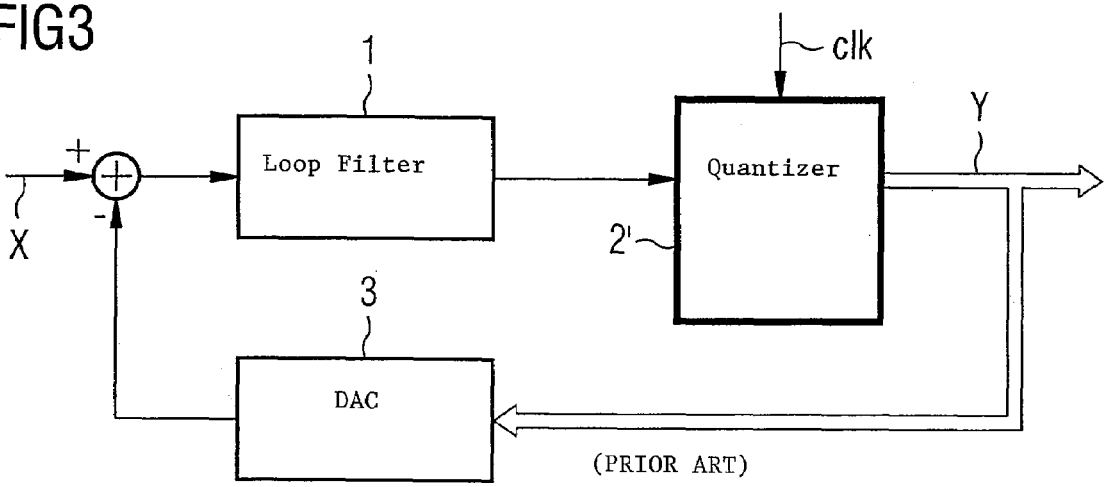
FIG. 3 shows a block diagram of a multilevel SD-ADC with the DEM functionality implemented in the quantizer (prior art)

With respect to FIGS. 1 to 3, reference is made to the introduction to the description.

Figure 4:
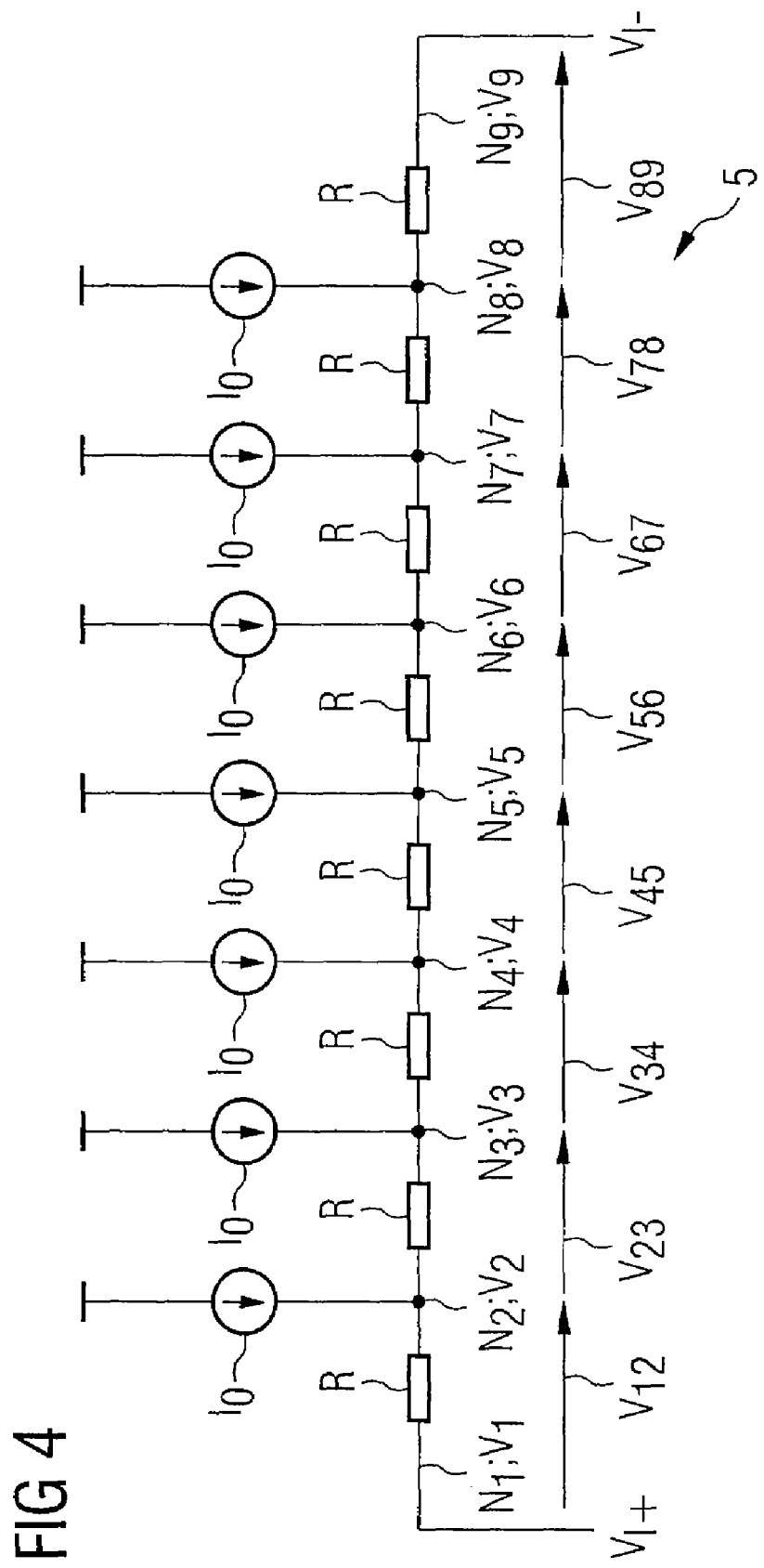
FIG. 4 shows a circuit diagram of a first exemplary embodiment of the input network as part of the quantizer according to the invention.

FIG. 4 shows a circuit diagram of a first exemplary embodiment of the input network 5 as part of a quantizer according to the invention. The input network 5 has a chain of N=8 identical resistors R. The input network also has N−1=7 identical current sources $I_0$, with each node $N_i$ between two resistors R in the resistor chain being fed by in each case one of the current sources $I_0$. In this case, a positive current $I_0$ is fed to each of the nodes of the resistors.

A differential quantizer input voltage $V_I = V_{I+} - V_{I-}$ with the single-ended potentials $V_{I+}$ and $V_{I-}$ is fed to the two outer nodes $N_1$ and $N_9$, respectively, in the resistor chain.

The following relationship is applicable to the two signal-ended potentials $V_{I+}$ and $V_{I-}$ of the differential quantizer input voltage $V_I$:

$$\begin{cases} V_{I+} = V_1 = V_{CM} + \dfrac{V_I}{2} \\ V_{I-} = V_{N+1} = V_{CM} - \dfrac{V_I}{2} \end{cases} \quad \text{(Equation 1)}$$

In this case, the potentials $V_1$ and $V_{N+1}=V_9$ describe the potentials at the two outer nodes $N_1$ and $N_9$, respectively, in the resistor chain, and the variable $V_{CM}$ describes the push-pull component of the quantizer input signal.

As can easily be seen from this, the following relationship applies to the potentials $V_i$ of the nodes $N_i$ in the resistor chain:

$$V_i = \dfrac{(N+1-i)}{N} \cdot V_{I+} + \dfrac{(i-1)}{N} \cdot V_{I-} + \dfrac{(i-1)(N+1-i)}{2} \cdot RI_0 \quad \text{(Equation 2)}$$

Figure 5:
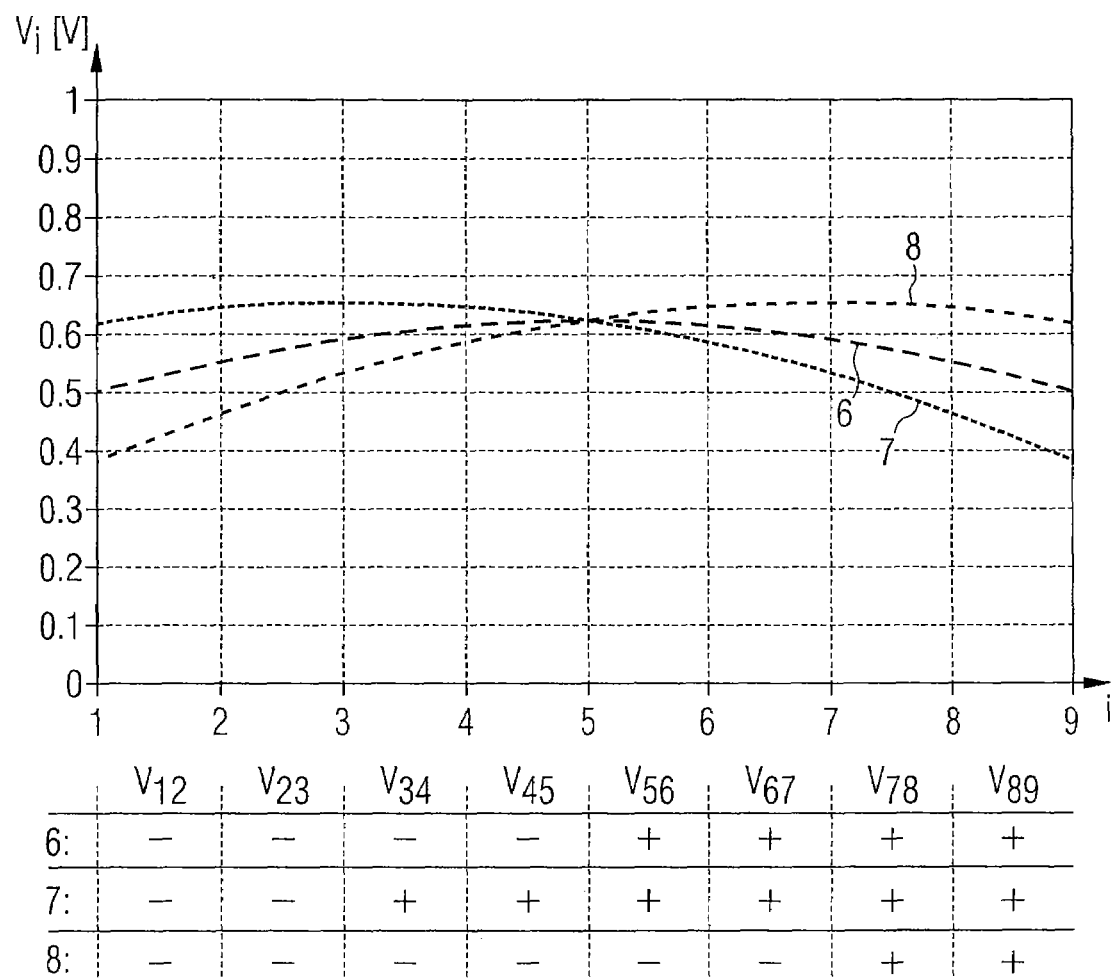
FIG. 5 shows three examples of profiles of the node potentials $V_i$ and of the distribution of the mathematical signs of the drive signals $V_{ij}$.

Three examples of potential profiles 6, 7 and 8 for N=8 are illustrated in the upper area of FIG. 5, in each case showing the potentials $V_i$ over the index i of the nodes $N_i$. The product $R \cdot I_0$ for the potential profiles 6, 7, 8 is chosen to be (1 V/64), and the push-pull component VCM is chosen to be 0.5 V. The potential profiles 6, 7 and 8 are respectively associated with quantizer input voltages $V_I$ of 0 V, 240 mV and −240 mV. As can be seen from FIG. 5, the potential profiles 6, 7 and 8 are parabolic. The maximum in the potential profile 6 when $V_I$=0 V occurs at the node $N_5$, that is to say in the centre of the resistor chain. For quantizer input voltages $V_I$ of $V_I>0$ V, the maximum migrates to the left in FIG. 5, as shown by way of example by the potential profile 7 for $V_I$=240 mV (maximum at the node $N_3$). Conversely, the maximum for quantizer input voltages $V_I$ of $V_I<0$ V migrates to the right, as can be seen from the potential profile 8 (maximum at the node $N_7$).

N drive signals $V_{ij}$ are used to drive the N comparators in the quantizer, corresponding to the potential difference $V_{ij}:=(V_i-V_j)$ between adjacent nodes $N_i$ and $N_j$, where j=i+1. In the case of the potential profile 6, that is to say $V_I$=0 V, the 4 drive signals $V_{12}$, $V_{23}$, $V_{34}$ and $V_{45}$ are negative, while the 4 drive signals $V_{56}$, $V_{67}$, $V_{78}$ and $V_{89}$ are positive. This mathematical-sign distribution of the drive signals $V_{ij}$ corresponds to the arrangement of the signs "+" and "−" at the bottom in FIG. 5 (first line). In the case of the potential profile 7 ($V_I$=240 mV), only the two drive signals $V_{12}$ and $V_{23}$ are negative (see the distribution of the mathematical signs in the second line at the bottom in FIG. 5) while, in the case of the potential profile 8 ($V_I$=−240 mV), only the two drive signals $V_{78}$ and $V_{89}$ are positive (see the distribution of the mathematical signs in the third line at the bottom in FIG. 5). The distribution of the mathematical signs corresponds to a digital thermometer code for the analogue quantizer input signal $V_I$. The resultant distribution of the mathematical signs can be detected by means of differentially driven comparators in the quantizer. Since it is in fact sufficient to determine the number of positive drive signals $V_{ij}$ for quantization of the quantizer input signal $V_I$, the drive signals $V_{ij}$ can be scrambled in their association with the comparators in order to provide the DEM functionality.

Equation 2 results in the following quantization thresholds for the input signal $V_I$:

$V_I$=−28·$RI_0$ for $V_9-V_8$=0

$V_I$=−20·$RI_0$ for $V_8-V_7$=0

$V_I$=−12·$RI_0$ for $V_7-V_6$=0

$V_I$=−4·$RI_0$ for $V_6-V_5$=0

$V_I$=+4·$RI_0$ for $V_5-V_4$=0

$V_I$=+12·$RI_0$ for $V_4-V_3$=0

$V_I$=+20·$RI_0$ for $V_3-V_2$=0

$V_I$=+28·$RI_0$ for $V_2-V_1$=0

The product $R \cdot I_0$ is calculated as follows, corresponding to the above quantization thresholds:

$$R \cdot I_0 = C/64 \quad \text{(Equation 3),}$$

where the variable C describes the width of the permissible value range (converter range) of the quantizer input signal $V_I$. If the variable C is chosen to be 1 V, the quantizer input signal $V_I$ may be chosen between −0.5 V and +0.5 V without the quantizer being distorted by overdriving.

Figure 6:
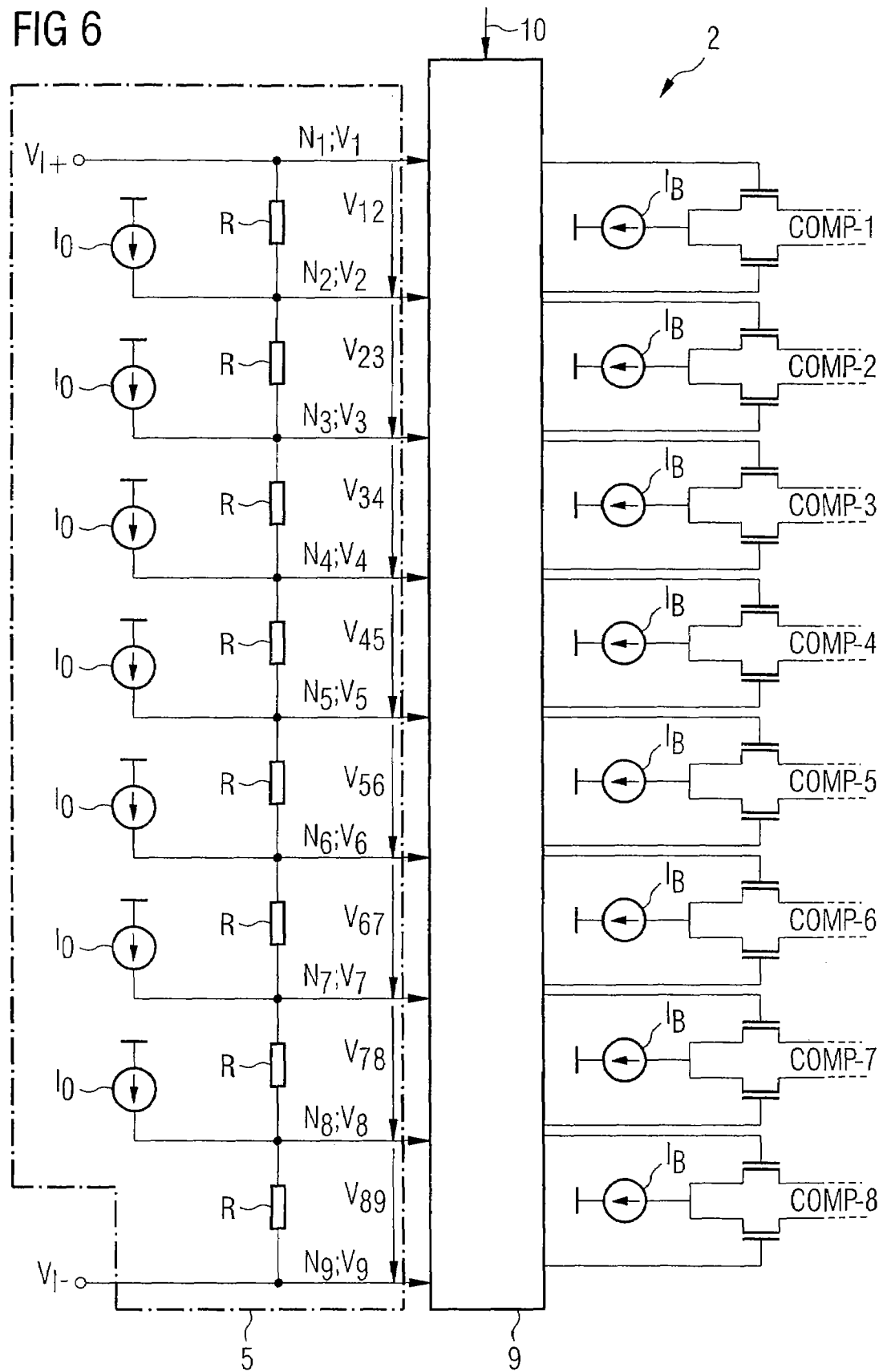
FIG. 6 shows a circuit diagram of one exemplary embodiment of a 3-bit flash quantizer according to the invention, with N=8 quantization thresholds, based on the input network illustrated in FIG. 4.

FIG. 6 shows a 3-bit flash quantizer 2' according to the invention (see FIG. 3; FIG. 3 also describes the SD-ADC according to the invention) with N=8 quantization thresholds as part of an SD-ADC according to the invention with a DEM functionality. In this case, signals and circuit parts which are provided with the same reference symbols in FIG. 4 and FIG. 6 correspond to one another. The flash quantizer 2' comprises the input network 5 which has already been illustrated in FIG. 4, a switching network (switch matrix) 9 and N=8 comparators COMP-i, with only the input differential amplifier stage of the comparators COMP-i being illustrated in FIG. 6.

On the input side, the flash quantizer 2' receives the quantizer input signal in the form of the differential voltage $V_I$, which corresponds to the output signal from the filter 1 (see FIG. 3). If the output signal from the filter 1 is a single-ended signal, this single-ended signal must first of all be converted to a differential signal by means of a signal converter (typically in the form of a differential amplifier). As has already been explained above, in conjunction with FIG. 4 and FIG. 5, the input network 5 generates a total of N=8 drive signals $V_{ij}$ as a function of the quantizer input signal $V_I$, and these are fed into the switching network 9. The switching network 9 is designed in such a manner that each drive signal $V_{ij}$ can be fed into each comparator COMP-i, that is to say each pair of adjacent nodes $N_i$ and $N_j$ can be connected with a low impedance to each differential comparator input. The switching network 9 has a large number of switches for this purpose.

The association between the differential drive signals $V_{ij}$ and the comparators COMP-i, that is to say the switch position of the switches in the switching network 9, is controlled via a control signal 10. The control signal 10 itself is generated in a control device outside the actual flash quantizer 2' using any desired DEM algorithm (not illustrated). By way of example, the control signal 10 can be generated in the same manner as in the document U.S. Pat. No. 6,346,898 B1, which has already been cited in the introduction. The value of the control signal typically changes with the clock clk of the quantizer 2' (see FIG. 3), that is to say the association between the drive signals $V_{ij}$ and the comparators COMP-i is rescrambled for each sampling time.

The mathematical sign of each of the drive signals $V_{ij}$ which have been scrambled by means of the switching network 9 is detected by means of the comparators COMP-i.

The output signals from the comparators COMP-i form the digital output signal Y of the quantizer 2'. The signal Y is in this case a scrambled thermometer-code signal, with the number of logic ones in the digital signal Y corresponding to the value of the analogue quantizer input signal.

Since each comparator output is permanently connected to a unit element of the DAC 3 in an SD-ADC according to the invention which comprises the flash quantizer 2' as shown in FIG. 6 in the manner illustrated in FIG. 3, different unit elements in the DAC 3 are activated at different sampling times when the quantizer input signal is constant.

As already mentioned, it will be possible to dispense with the switching network 9 in the flash quantizer 2' if there is no requirement to scramble the drive signals $V_{ij}$. The flash quantizer 2' reduced by the switching network 9 represents an alternative circuit concept to conventional flash quantizers which operate with different references.

It shall be noted that the above statement relating to the flash quantizer 2' according to the invention and as illustrated in FIG. 6 with N=8 quantization thresholds can also be transferred in an analogous manner to flash quantizers with any desired number N of quantization thresholds.

Figure 7:
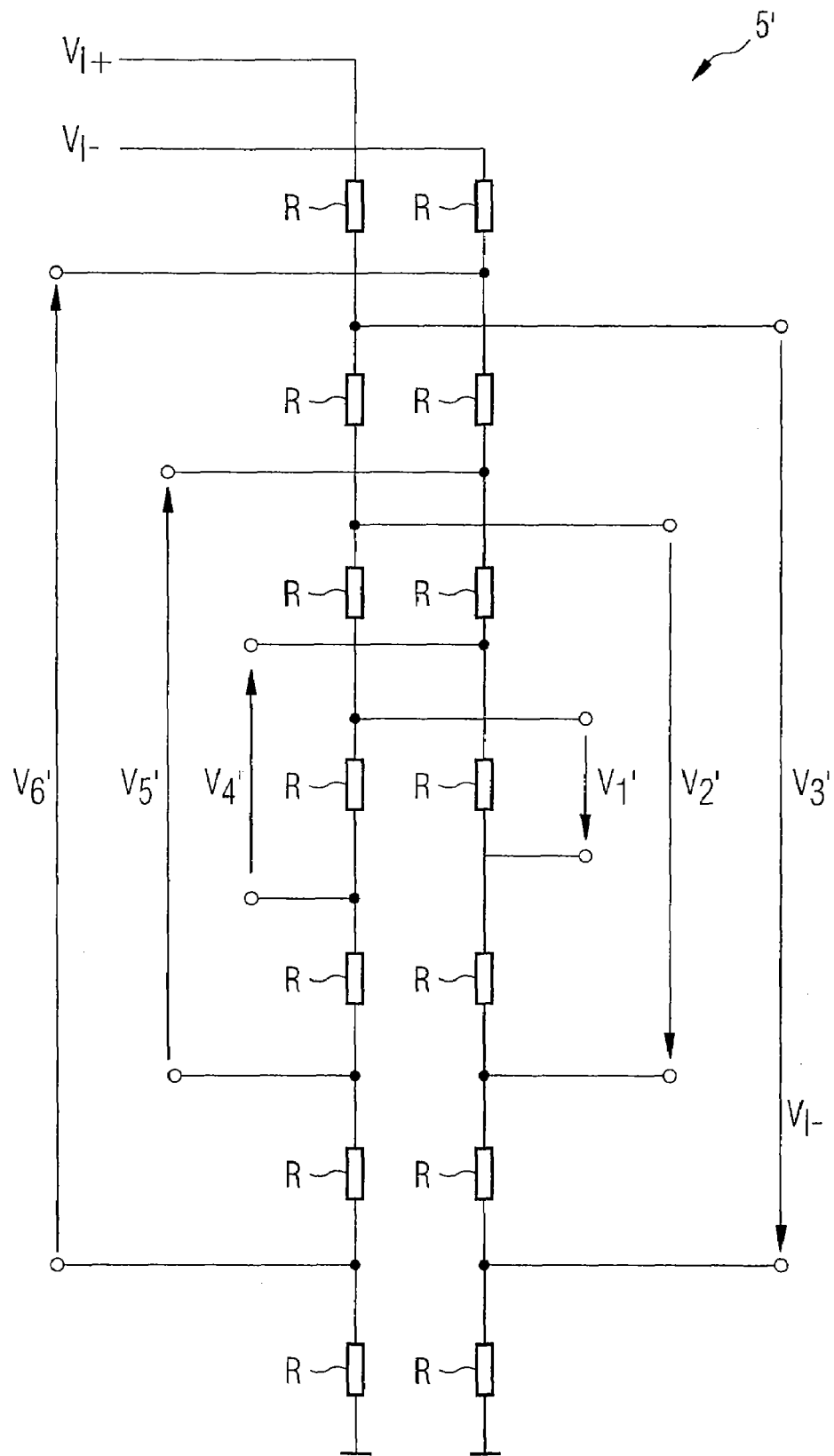
FIG. 7 shows a circuit diagram of a second exemplary embodiment of the input network.

FIG. 7 shows a second exemplary embodiment of an input network 5' of a flash quantizer 2' according to the invention, which generates N=6 drive signals $V_i'$ for N=6 comparators. The drive signals $V_i'$ are scrambled in a similar manner to that in FIG. 6 by means of a switching network 10. The input network 5' illustrated in FIG. 7 has two resistor chains, each having N+1=7 resistors R. The drive signals $V_i'$ are in each case formed in the manner illustrated in FIG. 7 as the difference between a node potential in the first resistor chain and a node potential in the second resistor chain. In the case of a differential quantizer input signal $V_I = V_{I+} - V_{I-}$ of 0 V, the drive signals $V_1'$, $V_2'$, $V_3'$ are positive, while the drive signals $V_4'$, $V_5'$, $V_6'$ are negative. As the positive quantizer input signal $V_I$ increases, the drive signal $V_4'$, becomes positive first of all, followed by V5' and finally $V_6'$. As the magnitude of the negative quantizer input signal $V_I$ increases, the drive signal $V_1'$ becomes negative first of all, followed by $V_2'$ and finally $V_3'$. The mathematical signs of the drive signals $V_i'$ can be detected in a similar manner to that in FIG. 6 by means of 6 comparators for indication of a quantized signal.

What is claimed is:

1. A quantizer having a plurality of N quantization thresholds for quantization of an analogue quantizer input signal for a sigma-delta analogue/digital converter, comprising
   an input network, which receives the quantizer input signal and generates N different drive signals, which are associated with the quantization thresholds, as a function of the quantizer input signal, in which case, for the drive signals, a value of the respective drive signal which is greater, or alternatively less, than a comparison value which is identical for all drive signals indicates that the quantizer input signal has exceeded the respectively associated quantization threshold,
   a plurality of N comparators each having one comparator input, and which, on the output side, generate a quantized signal which corresponds to the quantizer input signal, and
   a switching network, which receives the N drive signals and associates them with the N comparator inputs, in which case the association can be controlled as a function of a control signal.

2. A quantizer according to claim 1, wherein
   $N_-$ of the N drive signals each have a value less than the comparison value and $N_+$ of the N drive signals each have a value greater than the comparison value, and both the number $N_-$ and the number $N_+$ of the drive signals are dependent on the quantizer input signal.

3. A quantizer according to claim 1, wherein
   the quantizer input signal and the drive signals are differential signals, in particular with the comparison value being 0 V.

4. A quantizer according to claim 1, wherein
   the input network comprises a resistor chain of N resistors with identical resistances, in particular N identical resistors, with the N drive signals being obtained from the potentials at the nodes of the resistors.

5. A quantizer according to claim 3, wherein
   the differential quantizer input signal is received by both outer nodes of the resistor chain.

6. A quantizer according to claim 5, wherein
   the input network comprises N−1 current sources with identical currents, in particular N−1 identical current sources, with each node between two resistors in the resistor chain being fed from in each case one of the current sources.

7. A quantizer according to claim 6, wherein
   the N drive signals are each obtained from the difference between the potentials at the two nodes of a respectively different resistor of the N resistors.

8. A quantizer according to claim 6, wherein
   the following relationship applies to the potentials of the nodes of the N resistors:

$$V_i = \frac{(N+1-i)}{N} \cdot V_1 + \frac{(i-1)}{N} \cdot V_{N+1} + \frac{(i-1)(N+1-i)}{2} \cdot RI_0,$$

where the variable $V_i$ describes the potential at the i-th node in the resistor chain, the variable R describes the resistance of a resistor in the resistor chain, and the variable $I_0$ describes the current from one of the current sources.

9. A quantizer according to claim 6, wherein
   the product of the current from one of the current sources and the resistance of a resistor in the resistor chain is proportional to the width of the permissible voltage value range of the quantizer input signal.

10. A sigma-delta analogue/digital converter, comprising a quantizer according to claim 1, further comprising:
    a control device for generation of the control signal, with the association of the N drive signals with the N comparator inputs being controlled via the control signal.

11. A method of quantization of an analogue quantizer input signal for a sigma-delta analogue/digital converter, comprising the steps of:
    receiving the quantizer input signal
    generating N different drive signals which are associated with the quantization thresholds as a function of the quantizer input signal wherein for the drive signals a value of the respective drive signal which is greater than a comparison value which is identical for all drive signals indicates that the quantizer input signal has exceeded an associated quantization threshold,
    associating the drive signals with comparator inputs of N comparators, wherein the association can be controlled as a function of a control signal, and
    generating a quantized signal which corresponds to the quantizer input signal by the N comparators.

12. A method according to claim 11, wherein
$N_-$ of the N drive signals each have a value less than the comparison value and $N_+$ of the N drive signals each have a value greater than the comparison value, and both the number $N_-$ and the number $N_+$ of the drive signals are dependent on the quantizer input signal.

13. A method according to claim 11, wherein
the quantizer input signal and the drive signals are differential signals, in particular with the comparison value being 0 V.

14. A method of quantization of an analogue quantizer input signal for a sigma-delta analogue/digital converter, comprising the steps of:
receiving the quantizer input signal
generating N different drive signals which are associated with the quantization thresholds as a function of the quantizer input signal wherein for the drive signals a value of the respective drive signal which is less than a comparison value which is identical for all drive signals indicates that the quantizer input signal has exceeded an associated quantization threshold,
associating the drive signals with comparator inputs of N comparators, wherein the association can be controlled as a function of a control signal, and
generating a quantized signal which corresponds to the quantizer input signal by the N comparators.

15. A method according to claim 14, wherein $N_-$ of the N drive signals each have a value less than the comparison value and $N_+$ of the N drive signals each have a value greater than the comparison value, and both the number $N_-$ and the number $N_+$ of the drive signals are dependent on the quantizer input signal.

16. A method according to claim 14, wherein
the quantizer input signal and the drive signals are differential signals, in particular with the comparison value being 0 V.

* * * * *